United States Patent
Harley et al.

(10) Patent No.: US 8,409,902 B1
(45) Date of Patent: *Apr. 2, 2013

(54) ABLATION OF FILM STACKS IN SOLAR CELL FABRICATION PROCESSES

(75) Inventors: Gabriel Harley, Mountain View, CA (US); Taeseok Kim, Pleasanton, CA (US); Peter John Cousins, Menlo Park, CA (US)

(73) Assignee: SunPower Corporation, San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/486,095

(22) Filed: Jun. 1, 2012

Related U.S. Application Data

(63) Continuation of application No. 12/795,526, filed on Jun. 7, 2010, now Pat. No. 8,211,731.

(51) Int. Cl.
*H01L 21/00* (2006.01)

(52) U.S. Cl. .................... 438/57; 438/795; 438/940

(58) Field of Classification Search ................. None
See application file for complete search history.

(56) References Cited

U.S. PATENT DOCUMENTS

| | | | |
|---|---|---|---|
| 4,322,571 A | 3/1982 | Stanberry | |
| 5,432,015 A | 7/1995 | Wu et al. | |
| 5,738,731 A | 4/1998 | Shindo et al. | |
| 5,821,590 A | 10/1998 | Lee et al. | |
| 7,175,706 B2 * | 2/2007 | Mizutani et al. | 117/81 |
| 8,129,822 B2 | 3/2012 | Moslehi | |
| 8,211,731 B2 | 7/2012 | Harley et al. | |
| 2006/0060238 A1 | 3/2006 | Hacke et al. | |
| 2006/0196535 A1 | 9/2006 | Swanson et al. | |
| 2008/0035198 A1 | 2/2008 | Teppe et al. | |
| 2008/0157283 A1 | 7/2008 | Moslehi | |
| 2008/0299297 A1 | 12/2008 | Cousins et al. | |
| 2009/0107545 A1 | 4/2009 | Moslehi | |
| 2009/0151784 A1 | 6/2009 | Luan et al. | |
| 2009/0188553 A1 | 7/2009 | Dubin | |
| 2009/0239331 A1 | 9/2009 | Xu et al. | |
| 2009/0308457 A1 | 12/2009 | Smith | |
| 2010/0062560 A1 | 3/2010 | Farris, III et al. | |
| 2010/0276405 A1 | 11/2010 | Cho et al. | |
| 2010/0304522 A1 | 12/2010 | Rana et al. | |
| 2012/0028399 A1 | 2/2012 | Moslehi et al. | |

OTHER PUBLICATIONS

Unitek Miyachi Lasers Connections, "Understanding Laser Parameters for Weld Development" Technical Application Brief, 2003, 2 sheets, vol. 1/No. 3.
Overview: Lumera Laser Products, Jan. 2009, pp. 1-12.

* cited by examiner

*Primary Examiner* — Scott B Geyer
(74) *Attorney, Agent, or Firm* — Okamoto & Benedicto LLP

(57) ABSTRACT

A dielectric film stack of a solar cell is ablated using a laser. The dielectric film stack includes a layer that is absorptive in a wavelength of operation of the laser source. The laser source, which fires laser pulses at a pulse repetition rate, is configured to ablate the film stack to expose an underlying layer of material. The laser source may be configured to fire a burst of two laser pulses or a single temporally asymmetric laser pulse within a single pulse repetition to achieve complete ablation in a single step.

20 Claims, 4 Drawing Sheets

ABLATION OF FILM STACKS IN SOLAR CELL FABRICATION PROCESSES

CROSS-REFERENCE TO RELATED APPLICATION

This application is a continuation of U.S. application Ser. No. 12/795,526, filed on Jun. 7, 2010, which is incorporated herein by reference in its entirety.

STATEMENT REGARDING FEDERALLY SPONSORED RESEARCH OR DEVELOPMENT

This disclosure was made with Government support under Contract No. DEFC36-07GO17043 awarded by the United States Department of Energy.

BACKGROUND OF THE INVENTION

1. Field of the Invention

The present invention relates generally to solar cells, and more particularly but not exclusively to solar cell fabrication processes and structures.

2. Description of the Background Art

Solar cells are well known devices for converting solar radiation to electrical energy. They may be fabricated on a semiconductor wafer using semiconductor processing technology. A solar cell includes P-type and N-type diffusion regions. Solar radiation impinging on the solar cell creates electrons and holes that migrate to the diffusion regions, thereby creating voltage differentials between the diffusion regions. In a backside contact solar cell, both the diffusion regions and the metal contact fingers coupled to them are on the backside of the solar cell. The contact fingers allow an external electrical circuit to be coupled to and be powered by the solar cell.

Solar cell dielectric films may include multiple layers of various properties to satisfy fabrication and operating requirements. These layers are removed during fabrication to form metal contacts to the diffusion regions of the solar cell. The properties of these layers impact and may complicate removal of these layers.

SUMMARY

In one embodiment, a dielectric film stack of a solar cell is ablated using a laser. The dielectric film stack includes a layer that is absorptive in a wavelength of operation of the laser source. The laser source, which fires laser pulses at a pulse repetition rate, is configured to ablate the film stack to expose an underlying layer of material. The laser source may be configured to fire a burst of two laser pulses or a single temporally asymmetric laser pulse within a single pulse repetition to achieve complete ablation in a single step.

These and other features of the present invention will be readily apparent to persons of ordinary skill in the art upon reading the entirety of this disclosure, which includes the accompanying drawings and claims.

The use of the same reference label in different drawings indicates the same or like components. The drawings are not drawn to scale.

DETAILED DESCRIPTION

In the present disclosure, numerous specific details are provided, such as examples of apparatus, process parameters, materials, process steps, and structures, to provide a thorough understanding of embodiments of the invention. Persons of ordinary skill in the art will recognize, however, that the invention can be practiced without one or more of the specific details. In other instances, well-known details are not shown or described to avoid obscuring aspects of the invention.

Figure 1:
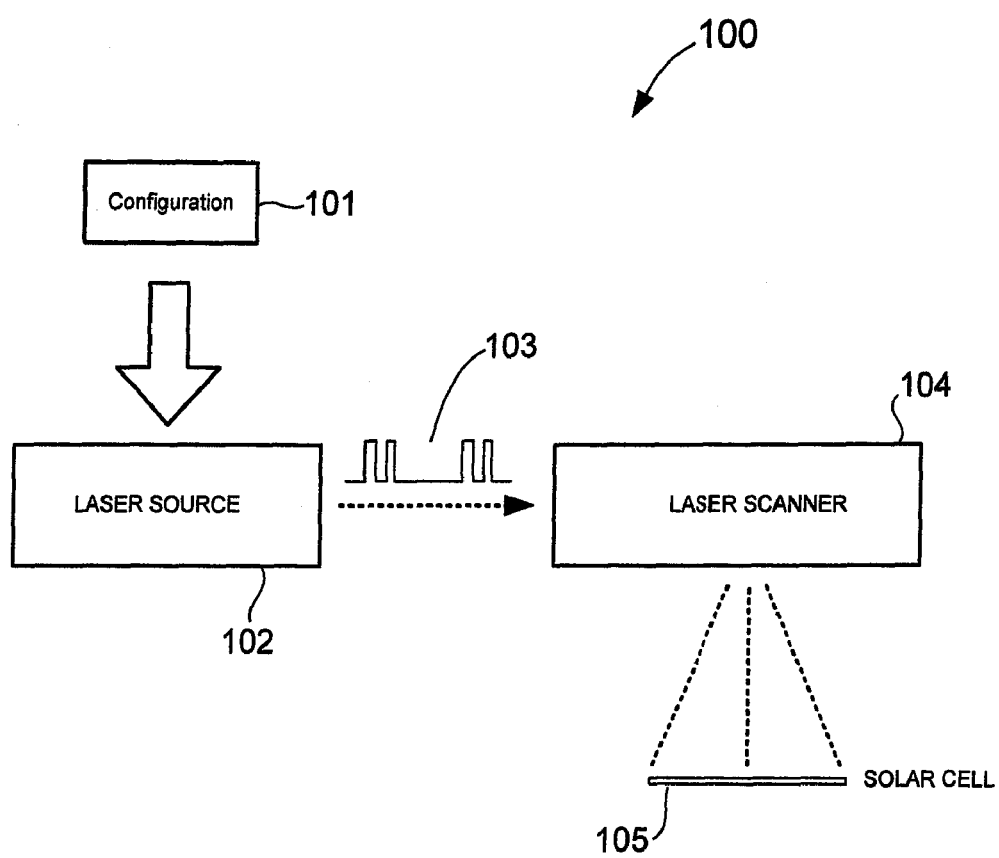
FIG. 1 schematically illustrates a solar cell ablation system 100 in accordance with an embodiment of the present invention.

FIG. 1 schematically illustrates a solar cell ablation system 100 in accordance with an embodiment of the present invention. In the example of FIG. 1, the ablation system 100 includes a laser source 102 and a laser scanner 104. Laser source 102 may be a commercially available laser source. The laser scanner 104 may comprise a galvanometer laser scanner, such as those commercially available from ScanLabs of Germany. In operation, the laser source 102 generates laser pulses 103 at a predetermined wavelength, in accordance with a configuration 101. The configuration 101 may comprise switch/knob arrangements, computer-readable program code, software interface settings, and/or other ways of setting the configurable parameters of the laser source 102. The configuration 101 may set the pulse repetition rate, number of pulses fired per repetition, pulse shape, pulse amplitude, pulse intensity or energy, and other parameters of the laser source 102. The laser scanner 104 scans the laser pulses 103 across a solar cell 105 being fabricated to remove materials from the solar cell 105.

Figure 2:
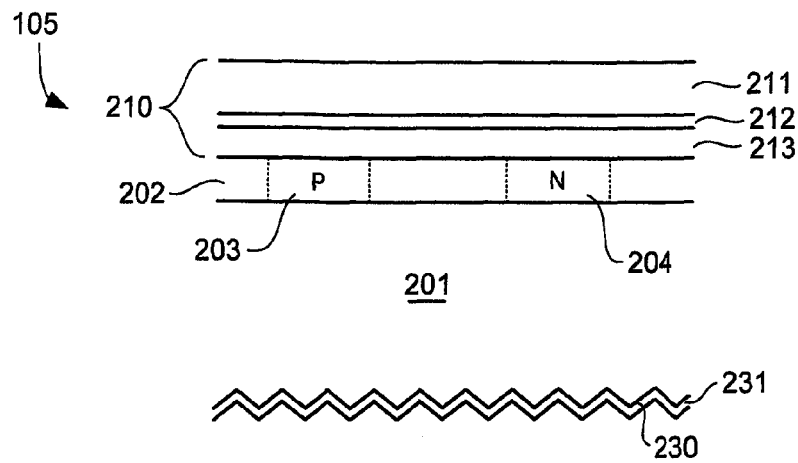
FIGS. 2-4 show cross sections of a solar cell being fabricated in accordance with an embodiment of the present invention.

FIG. 2 shows a cross section of the solar cell 105 being fabricated in accordance with an embodiment of the present invention. In the example of FIG. 2, the solar cell 105 includes a solar cell substrate 201 comprising an N-type silicon wafer. A dielectric film stack 210 is formed on a layer 202, which comprises polysilicon in this example. The film stack 210 comprises multiple layers of materials, which in the example of FIG. 2 include a film 211, a film 212, and a film 213. As shown in FIG. 2, the film 211 may be formed on the film 212, which in turn is formed on the film 213. In one embodiment, the film 211 comprises a layer of silicon nitride formed to a thickness of 300 to 1000 angstroms, the film 212 comprises a layer of amorphous silicon formed to a thickness of 30 to 50 angstroms, and the film 213 comprises silicon dioxide formed to a thickness of about 120 angstroms. The film 212 may also comprise polysilicon or mc-silicon, depending on the application.

In one embodiment, the layer 202 comprises polysilicon formed to a thickness of about 2000 angstroms. A P-type diffusion region 203 and an N-type diffusion region 204 are formed in the layer 214. There are several diffusion regions in a solar cell but only one of each conductivity type is shown in FIG. 2 for clarity of illustration. The solar cell 105 is an example of a backside contact solar cell in that the diffusion regions 203 and 204, including metal contacts electrically coupled to them (see FIG. 4), are formed on the backside of the solar cell over the backside of the substrate 201. The front side of the solar cell 105, which faces the sun to collect solar radiation during normal operation, is opposite the backside. In the example of FIG. 2, the front side surface of the substrate 201 is textured with random pyramids 230. An anti-reflective layer 231 comprising silicon nitride is formed on the textured surface on the front side.

The amorphous silicon film 212 prevents HV degradation, and provides UV stability, among other advantageous functions. The amorphous silicon also enhances conductivity of the film stack 210 to provide a lateral conductive path for preventing harmful polarization. The use of amorphous silicon in solar cells is also disclosed in commonly-owned U.S. patent application Ser. No. 12/750,320, titled Leakage Pathway Layer for Solar Cell, filed on Mar. 30, 2010.

Generally speaking, a typical solar cell includes semiconductor material that is absorbing in the UV-IR range, with a transparent dielectric film stack for passivation and reliability. For low damage ablation of dielectric films on high-efficiency semiconductor devices, lasers with short pulse lengths and long wavelengths are desired to minimize thermal and optical absorption. This type of ablation of a transparent film stack is known as indirectly induced ablation, of the non-thermal type, whereby the laser energy passes through the film stack, is absorbed in the semiconductor, causing ablation. This results in ablation force breaking through the dielectric film and is achievable within a single pulse.

In other solar cells, such as the solar cell 105, a thin, absorbing film in the dielectric film stack enhances conductivity or other electrical properties beneficial to the solar cell. If the thin film is absorptive enough in the wavelength of the laser used in the ablation, it is possible that the ablation process of the thin film becomes directly induced, which means that the thin film will ablate first, and may thus interfere with and prevent the ablation of any remaining layers between the thin film and the semiconductor. This results in incomplete ablation, requiring either a post-laser step to remove the remaining layer, another ablation step, or switching to a laser with a different wavelength. These solutions require additional processing steps and/or additional equipment, which increase fabrication costs.

Using a laser wavelength that is transparent to all layers in the film stack is a desirable potential solution. However, if the absorptive material in the film stack is similar to the semiconductor substrate, e.g., amorphous silicon and silicon as in the solar cell 105, a wavelength that is transparent to the thin film will also be transparent to the semiconductor substrate. This makes occurrence of indirect ablation difficult to achieve without damaging the substrate material, i.e., inducing emitter recombination. While this may be acceptable in lower efficiency solar cell structures that have other forms of recombination, optical and thermal absorption need to be minimized in high-efficiency solar cells.

One possible solution to the incomplete ablation problem is to use multiple laser pulses to drill through the layers of the film stack. However, drilling the wafer is relatively difficult to do without either increasing the throughput by adding multiple passes, or by keeping the laser fixed over a specific point. This is especially difficult to do on a galvanometer based system because the laser pulse needs to occur in the same location, and moving the laser beam at high speed is required for high throughput. Furthermore, when using multiple pulses, thermal budget must be well managed to prevent any recombination defects and mechanical damage to the substrate.

Figure 3:
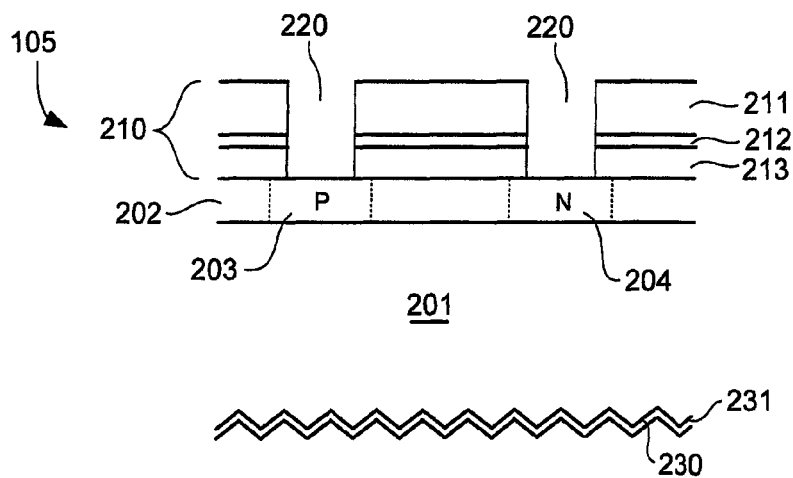
Figure 4:
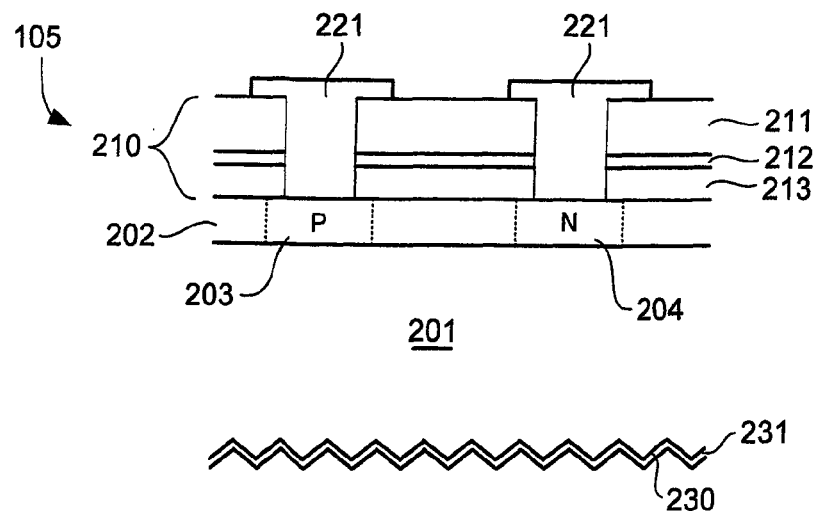

In the example of FIG. 2, the ablation system 100 of FIG. 1 is employed to ablate the silicon nitride film 211, the amorphous silicon film 212, and the oxide film 213 to form a hole through them and expose the diffusion regions 203 and 204. The ablation process is illustrated in FIG. 3, where the ablation step formed holes 220 exposing the diffusion regions 203 and 204. This allows for formation of metal contacts 221 to be formed in the holes 220, as illustrated in FIG. 4. The metal contacts 221 allow external electrical circuits to make electrical connection to the diffusion regions 203 and 204.

In one embodiment, the amorphous silicon film 212 is absorptive in the wavelength of the laser generated by the laser source 102. That is, the amorphous silicon film 212 absorbs the energy of the laser pulses 103 at the wavelength of operation of the laser source 102, making it relatively difficult to achieve complete ablation of the oxide film 213 using a single laser pulse within one repetition. In one embodiment, the laser source 102 is a 532 nm laser in that it generates laser beam at a wavelength of 532 nm.

Figure 5:
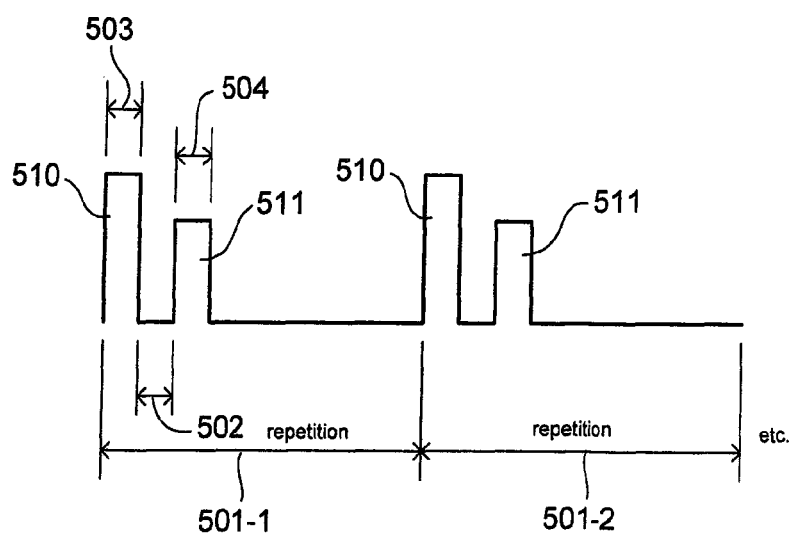
FIG. 5 schematically shows a burst of laser pulses for ablating a film stack of a solar cell in accordance with an embodiment of the present invention.
Figure 6:
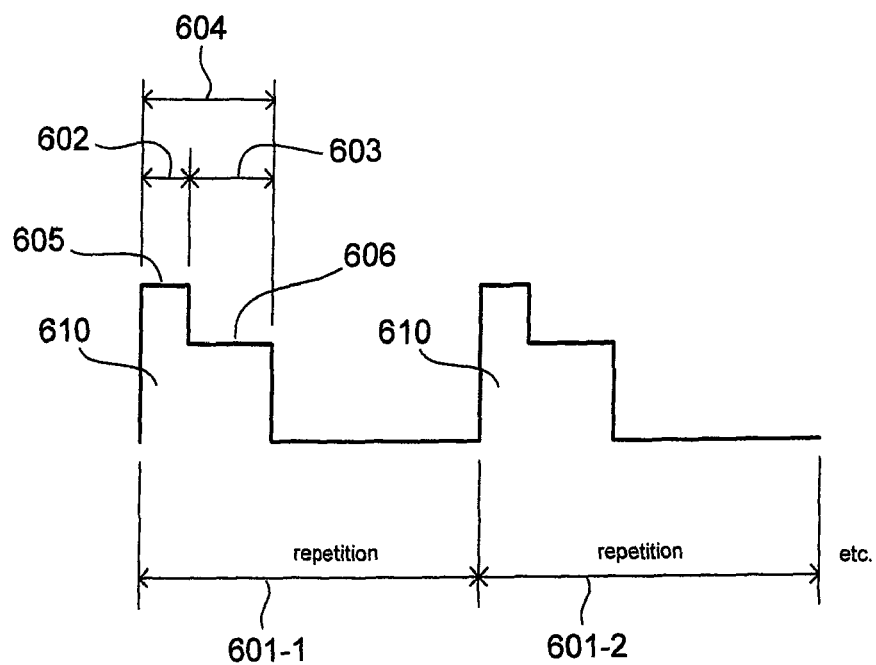
FIG. 6 schematically shows a temporally asymmetric laser pulse for ablating a film stack of a solar cell in accordance with another embodiment of the present invention.

In one embodiment, the laser source 102 is configured to fire a burst of laser pulses in a single pulse repetition to form the holes 220 in a single ablation step. FIG. 5 schematically illustrates a burst of laser pulses fired by the laser source 102 in accordance with an embodiment of the present invention. In the example of FIG. 5, a burst of laser pulses 510 and 511 are fired by the laser source 102 one after the other. The laser source 102 is configured to fire the laser pulses 510 and 511 at a repetition rate. Each pulse repetition is labeled as 501 (i.e., 501-1, 501-2, etc.) in FIG. 5. Note that while two repetitions are shown in FIGS. 5 and 6, embodiments of the present invention allow for complete ablation of the film stack in one repetition. Within a single repetition 501, the laser pulse 511 is fired a time delay (labeled as 502) after the laser pulse 510. The delay time 502 may be between 1 ns and 1 μs, for example. In general, the delay time between the laser pulses 510 and 511 is selected such that the laser pulses 510 and 511 are not noticeably separated on the ablation point on the solar cell due to the relatively slower motion of the laser scanner 104. The amplitude of the laser pulse 511 is lower than that of the laser pulse 510. That is, the laser pulse 511 has less pulse energy (e.g., about 37% to 50% less energy) than the laser pulse 510. The laser pulse 510 ablates the silicon nitride film 211 and the amorphous silicon film 212 to form a hole through them. The laser pulse 511, after a delay time 502 in the same repetition, ablates the oxide film 213 to complete the hole through the film stack 210 and thereby exposes the polysilicon layer 202. The lesser energy of the laser pulse 511 minimizes damage to material under the oxide film 213. Depending on the application, the energy of the laser pulse 511 may also be equal or less than the energy of the laser pulse 510.

The pulse energies of the laser pulses 510 and 511 may be varied depending on the type and thicknesses of the films being ablated. In one embodiment, the pulse energy of the laser pulse 510 is 10 μJ in a case where the thickness of the silicon nitride film 211 is 300 angstroms, the thickness of the amorphous silicon film 212 is 40 angstroms, and the thickness of the oxide film 213 is 120 angstroms. The pulse energy of the laser pulse 511 is set to approximately 37% of that of the laser pulse 510 in that example.

Still referring to FIG. 5, the laser pulse 510 has a pulse width 503 and the laser pulse 511 has a pulse width 504. The laser pulses 510 and 503 are "burst" in that they are fired relatively close to each other. A commercially available laser 103 with burst mode is available from Lumera Laser GmbH of Germany. In one embodiment, the pulse width 503 is 14 ps and the pulse width 504 is also 14 ps, with a delay 502 of 20 ns, at a pulse repetition rate of 200 kHz (spacing for 501-1).

In another embodiment, the laser source 102 is configured to fire a single temporally asymmetric laser pulse in a single pulse repetition to form the holes 220 in a single ablation step. This embodiment is schematically shown in FIG. 6, where the laser source 102 firing at a pulse repetition rate fires a single temporally asymmetric laser pulse 610 within a single pulse repetition 601 (i.e., 601-1, 601-2, etc.). As its name implies, the laser pulse 610 is asymmetric in time, having a first peak 605 in the earlier part of the laser pulse 610 and a second peak 606 in the later part of the pulse. In general, as shown in FIG. 6, the earlier time portion of the laser pulse 610 is configured to have higher intensity compared to the later time portion of the laser pulse 610. The relative intensities between the two portions of the laser pulse 610 is controlled such that residue after the earlier portion is removed during the later portion to achieve complete laser ablation without inducing laser damage. Because the laser energy is continuously maintained during the ablation, the residue left form the earlier portion is still in the elevated temperature and can be removed at lower fluence than in room temperature ablation. An example laser source 102 that may be configured to generate a single temporally asymmetric pulse per repetition is commercially available from SPI Lasers.

In one embodiment, the peak 605 ablates the silicon nitride film 211 and the amorphous silicon film 212 to form a hole through them, and the peak 606 ablates the oxide film 213 to complete the hole through the film stack 210 and thereby exposes the polysilicon layer 202. The lesser intensity of the peak 606 minimizes damage to material under the oxide film 213. In one embodiment, the laser pulse 610 has a wavelength of 532 nm.

The intensities of peaks 605 and 606 may be varied depending on the type and thicknesses of the films being ablated. In one embodiment, the intensity of the peak 605 is 10 µJ and the intensity of the peak 606 is 3 µJ in a case where the thickness of the silicon nitride film 211 is 300 angstroms, the thickness of the amorphous silicon film 212 is 40 angstroms, and the thickness of the oxide film 213 is 120 angstroms. The pulse 610 has a pulse width 604, with the peak 605 having a width 602 and the peak 606 having a width 603. In the just mentioned example, the pulse width 604 is 20 ns the pulse width 602 is 10 ps and the pulse width 603 is 20 ns at a pulse repetition rate of 200 kHz.

Figure 7:
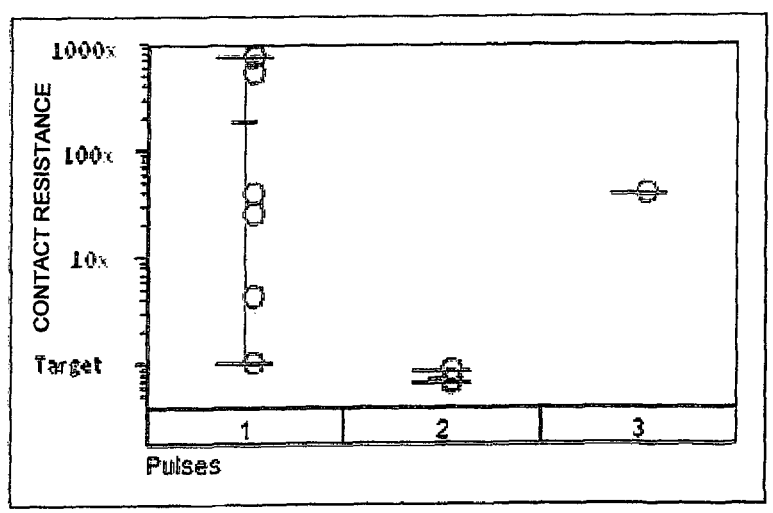
FIG. 7 shows a summary of tests comparing the use of a burst of two laser pulses, a single laser pulse with high pulse energy, and three laser pulses of varying pulse energies to ablate through a dielectric film.

FIG. 7 shows a summary of tests comparing the use of a burst of two laser pulses as in FIG. 5, a single laser pulse with high pulse energy, and three laser pulses of varying pulse energies to ablate through the dielectric film 210. In FIG. 7, the vertical axis represents the measured contact resistance to the exposed diffusion region with the target indicating the control contact resistance for relative comparison. The column labeled as "1" indicates test results for the single pulse laser, "2" indicates test results for the burst of two laser pulses, and "3" indicates test results for the three laser pulses. As is evident in FIG. 7, the two laser pulses fired in burst mode advantageously resulted in the least contact resistance.

Techniques for ablating film stacks in solar cell fabrication processes have been disclosed. While specific embodiments of the present invention have been provided, it is to be understood that these embodiments are for illustration purposes and not limiting. Many additional embodiments will be apparent to persons of ordinary skill in the art reading this disclosure.

What is claimed is:

1. A method of fabricating a solar cell, the method comprising:
   providing a film stack comprising a first film and a second film, the first film being formed over the second film, the first film comprising silicon, the first film and the second film being over a silicon substrate; and
   in a single pulse repetition of a laser source firing at a pulse repetition rate, forming a hole through the first film and the second film.

2. The method of claim 1 wherein the first film comprises silicon nitride.

3. The method of claim 1 wherein a first laser pulse and a second laser pulse are fired within the single pulse repetition, the second laser pulse being fired after a delay time after firing the first laser pulse.

4. The method of claim 3 wherein the first laser pulse has a higher energy than the second laser pulse.

5. The method of claim 3 wherein the first laser pulse forms the hole through the first film and the second film, and the second laser pulse forms the hole through a third film that is between the second film and the silicon substrate.

6. The method of claim 1 wherein the second film comprises an oxide.

7. The method of claim 1 wherein the hole exposes a diffusion region of the solar cell.

8. The method of claim 1 wherein a temporally asymmetric laser pulse having a first peak and a second peak is fired within the single pulse repetition, the first peak having an energy higher than that of the second peak.

9. A method of fabricating a solar cell, the method comprising:
   firing one laser pulse within a single repetition of a laser source that is firing laser pulses at a repetition rate, the one laser pulse being temporally asymmetric and having a first peak and a second peak, the first peak occurring first in time relative to the second peak in the single repetition, the first peak having an energy higher than that of the second peak; and
   ablating a first film and a second film of a film stack with the one laser pulse within the single repetition, the first film comprising silicon, the film stack being over a silicon substrate.

10. The method of claim 9 wherein the first film comprises silicon nitride.

11. The method of claim 9 further comprising:
   ablating a third film of the film stack with the one laser pulse within the single repetition.

12. The method of claim 11 wherein the first peak ablates the first film and the second film.

13. The method of claim 9 wherein the second film comprises an oxide.

14. The method of claim 9 wherein the hole exposes a diffusion region of the solar cell.

15. A method of fabricating a solar cell, the method comprising:
   firing laser pulses from a laser source that fires at a pulse repetition rate; and
   forming a hole through a first film and a second film of a film stack in a single pulse repetition of the laser source, the first film comprising silicon, the film stack being over a silicon substrate.

16. The method of claim 15 wherein the first film comprises silicon nitride.

17. The method of claim 15 wherein the second film comprises an oxide.

18. The method of claim 15 wherein a first laser pulse and a second laser pulse are fired by the laser source in the single pulse repetition.

19. The method of claim 18 wherein the first laser pulse forms the hole through the first film and the second film.

20. The method of claim 15 wherein the hole exposes a diffusion region of the solar cell.

* * * * *